United States Patent
Mizuta

(10) Patent No.: US 6,170,116 B1
(45) Date of Patent: *Jan. 9, 2001

(54) ABRASIVE MEMBER AND CLEANING DEVICE FOR PROBE NEEDLE FOR PROBE CARD

(75) Inventor: Masaharu Mizuta, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/058,891

(22) Filed: Apr. 13, 1998

(30) Foreign Application Priority Data

Nov. 4, 1997 (JP) .................................. 9-301861

(51) Int. Cl.$^7$ ..................................... A47L 13/04
(52) U.S. Cl. ............... 15/229.12; 15/210.1; 451/456; 451/536; 442/50; 442/52; 442/54; 134/42
(58) Field of Search ............ 15/1.51, 218, 218.1, 15/210.1, 229.11, 229.12; 451/536, 533, 526, 456; 442/50, 52, 54; 428/198; 134/42

(56) References Cited

U.S. PATENT DOCUMENTS

| | | | |
|---|---|---|---|
| 2,365,022 | * 12/1944 | Sturtevant ............................ 15/210.1 |
| 3,982,357 | * 9/1976 | Eldridge et al. ....................... 15/218.1 |
| 4,104,435 | * 8/1978 | Ballesteros .......................... 15/229.12 |
| 4,996,800 | * 3/1991 | Mangus ................................ 15/218.1 |
| 5,471,705 | * 12/1995 | Dao ......................................... 15/218 |
| 5,626,512 | * 5/1997 | Palaikis et al. ......................... 451/536 |

FOREIGN PATENT DOCUMENTS 4-364746  12/1992 (JP) .

* cited by examiner

Primary Examiner—Robert J. Warden, Sr.
Assistant Examiner—Theresa J. Snider
(74) Attorney, Agent, or Firm—McDermott, Will & Emery

(57) ABSTRACT

An abrasive member and a cleaning device for a probe needle of a probe card are obtained which are capable of simplifying an operation of cleaning a probe needle of a probe card and also eliminating the step of employing an organic solvent or the like in the probe needle cleaning operation to improve the operating environment. In the cleaning device for a probe needle of a probe card, an abrasive member for a probe needle includes first and second fiber materials formed of at least one selected from the group consisting of a metal fiber, a carbon fiber and a ceramic fiber. The first and second fiber materials extend in different directions and are fixed to each other at a region thereof. A surface of abrasive member is provided with a space having approximately the same width as the width of the tip of a probe needle.

12 Claims, 9 Drawing Sheets

ABRASIVE MEMBER AND CLEANING DEVICE FOR PROBE NEEDLE FOR PROBE CARD

BACKGROUND OF THE INVENTION

1. Field of the Invention

The present invention relates to a cleaning device for semiconductor inspection devices and particularly to an abrasive member and a cleaning device for a probe needle for a probe card.

2. Description of the Background Art

Conventionally, a device referred to as a probe card has been used in the inspection process of semiconductor devices. FIG. 15 is a cross section of a conventional probe card. The conventional probe card shown in FIG. 15 has an opening 114 formed approximately at the center of a substrate 116. Provided around opening 114 are a plurality of probe needles 111 towards the center of opening 114. Probe needle 111 is connected via a wiring to a terminal (not shown) arranged at a periphery of substrate 116. In inspecting a semiconductor device, the terminal is connected to an inspection device referred to as a prober. The probe card is arranged opposite to a surface of a semiconductor device to be inspected and is also arranged to allow the tip of probe needle 111 to come in contact with an electrode formed on the surface of the semiconductor device. Electrical characteristics of the semiconductor device are thus inspected via probe needle 111 in contact with the electrode formed on the surface of the semiconductor device.

FIG. 16 is a schematic diagram for illustrating the conventional probe needle 111 shown in FIG. 15. In FIG. 16, a lead portion of the probe needle has a diameter D of approximately 0.25 mm, an end of the probe needle has a length L of approximately 7 mm, and a tip 112 of the probe needle that comes in contact with an electrode of a semiconductor device has a diameter d of approximately 30 $\mu$m. The materials for the probe needle include tungsten or the like.

In inspecting a semiconductor device, tip 112 of the probe needle comes into contact with an electrode 105 formed on a surface of the semiconductor device, as shown in FIGS. 17 and 18. FIGS. 17 and 18 are schematic views for illustrating how the tip of the probe needle comes in contact with the electrode formed on the surface of the semiconductor device. As shown in FIG. 17, as a semiconductor device 117 is raised towards probe needle 111, electrode 105 formed on the surface of semiconductor device 117 comes into contact with tip 112 of probe needle 111. Electrode 105 of semiconductor device 117 is formed of aluminum, and a thin aluminum oxide layer 118 is formed on a surface of electrode 105. Since aluminum oxide layer 118 is an insulator, tip 112 of probe needle 111 simply pressed against electrode 105, as shown in FIG. 17, does not result in an aluminum layer 119, which is positioned under aluminum oxide layer 118, coming into contact with tip 112 of probe needle 115 and probe needle 111 cannot pass current to electrode 105.

Accordingly, semiconductor device 117 is typically further raised after tip 112 of probe needle 111 is brought into contact with electrode 105, as shown in FIG. 18. Probe needle 111 is thus elastically deformed and tip 112 of probe needle 111 is horizontally moved on electrode 105. Aluminum oxide layer 118 on the surface of electrode 105 is thus partially removed from the surface of the electrode to allow aluminum layer 119 as the exact electrode to come into direct contact with tip 112 of probe needle 111. The process shown in FIG. 18 will be referred to as an overdrive process hereinafter. Tip 112 of probe needle 111 has thus come into contact with electrode 105 in conventional inspection processes.

However, a portion of aluminum oxide layer 118 removed from the surface of electrode 105 in the overdrive process shown in FIG. 18 adheres to tip 112 of probe needle 111, as shown in FIG. 19. When a foreign matter 113, such as aluminum oxide, as an insulator thus adheres to tip 112 of probe needle 111, foreign matter 113 prevents the electrical connection between tip 112 of probe needle 111 and electrode 105 (shown in FIG. 18) of the semiconductor device, which makes it difficult to pass a predetermined current to electrode 105. Accordingly, repeated use of such a probe needle has disadvantageously resulted in an inaccurate inspection of semiconductor devices.

Accordingly, a cleaning operation of probe needles has been conventionally provided so that foreign matter 113, such as aluminum oxide, is removed from tip 112 of probe needle 111.

FIG. 20 shows a cross section of an abrasive sheet for probe needles that is used in a conventional cleaning operation of probe needles. The conventional abrasive sheet 102 for probe needles in FIG. 20 employs silicon rubber 120 as a matrix, and abrasive grains 121, such as artificial powdery diamond, are dispersedly arranged in silicon rubber 120. When tip 112 (shown in FIG. 19) of probe needle 111 (shown in FIG. 19) is stuck into abrasive sheet 102 predetermined times, abrasive grains 121 in abrasive sheet 102 allows foreign matter 113 (shown in FIG. 19) to be scratched off the surface of probe needle 111. Thus, foreign matter 113 has been conventionally removed from tip 112 of probe needle 111.

FIG. 21 is a flow chart of a conventional, probe needle cleaning operation comprising by four steps. Step 1 is the step of arranging a probe card opposite to an abrasive sheet. Step 2 is the step of sticking the tip of a probe needle into the abrasive sheet predetermined times. FIG. 22 schematically shows the tip of probe needle being stuck into the abrasive sheet the predetermined times in step 2. As shown in FIG. 22, tip 112 of probe needle 111 is stuck into abrasive sheet 102 and foreign matter 103, such as aluminum oxide, adhering to tip 112 of probe needle 111 can thus be scratched off by abrasive grains 121 in abrasive sheet 102.

When step 2 is completed, however, a viscous silicon rubber film 124 resulting from the silicon rubber as the matrix of abrasive sheet 102 (shown in FIG. 22) that is softened adheres to tip 112 of probe needle 111, as shown in FIG. 23. A foreign matter 122 also adheres to silicon rubber film 124. Foreign matter 122 includes foreign matter 113 (shown in FIG. 22), such as aluminum oxide, removed from tip 112 of probe needle 111 in step 2, abrasive grains 121 (shown in FIG. 22) removed from abrasive sheet 102, a removed portion of silicon rubber 120 as the matrix of abrasive sheet 102 and the like.

Accordingly, the conventional probe needle cleaning operation requires the step of spraying an organic solvent on the tip of the probe needle and thus removing foreign matter 122 (shown in FIG. 23) adhering to the tip, as indicated in FIG. 21. FIG. 24 schematically shows a performance of step 3. As shown in FIG. 24, an organic solvent 123 is sprayed on tip 112 of probe needle 111, silicon rubber film 124 is dissolved and silicon rubber film 124 and foreign matter 122 are thus removed from tip 112.

When step 3 is completed, organic solvent 123 adheres to probe needle 111, as shown in FIG. 25. Accordingly, the conventional probe needle cleaning operation provides the step of blowing air against probe needle 111 (shown in FIG. 25) as step 4, as shown in FIG. 21, to dry organic solvent 123 (shown in FIG. 25) adhering to the tip of probe needle 111, and simultaneously blowing off foreign matters and the like remaining on the surface of probe needle 111.

Conventional probe needle cleaning operations have thus been performed.

As described above, a conventional probe needle cleaning operation provides sticking tip 112 of a probe needle into abrasive sheet 102 predetermined times, as shown in FIG. 22, to remove foreign matter 113, such as aluminum oxide, adhering to tip 112 of the probe needle, while silicon rubber 120 as the matrix of abrasive sheet 102 is softened and becomes viscous silicon rubber film 124 which in turn adheres to tip 112 of the probe needle, as shown in FIG. 23. Accordingly, foreign matter 122 has also adhered to silicon rubber film 124 at completion of the step of sticking tip 112 of the probe needle into abrasive sheet 102 (shown in FIG. 22) the predetermined times. Thus, the cleaning step by means of organic solvent is required, as shown in FIG. 24, which increases the number of steps of the probe needle cleaning operation.

Furthermore, since the cleaning operation by means of organic solvent is provided by spraying organic solvent 123 on tip 112 of the probe needle, as shown in FIG. 24, the operator can inhale the sprayed organic solvent and thus the cleaning step can adversely affect human body and result in an unsatisfactory working environment.

SUMMARY OF THE INVENTION

One object of the present invention is to provide an abrasive member for a probe needle, capable of simplifying the cleaning operation of a probe needle for a probe card.

Another object of the present invention is to provide an abrasive member for a probe needle, capable of improving the operating environment by eliminating the step of employing organic solvents or the like in the cleaning operation of a probe needle for a probe card.

Still another object of the present invention is to provide a probe needle cleaning device capable of simplifying the cleaning operation of a probe needle for a probe card.

Still another object of the present invention is to provide a probe needle cleaning device capable of eliminating the step of employing organic solvents or the like in the cleaning operation of a probe needle for a probe card and thus improving the operating environment.

In one aspect of the present invention, an abrasive member for probe needles of a probe card includes at least one type of fiber material selected from the group consisting of metal fiber, carbon fiber and ceramic fiber. The fiber material includes first and second fiber materials extending in different directions and fixed to each other at a region thereof. A space having approximately the same width as the width of the tip of a probe needle is formed in a surface of the abrasive member.

Accordingly, when the tip of the probe needle is pressed against the abrasive member, the tip can enter the inside of the abrasive member. When the tip of the probe needle enters the inside of the abrasive member, the tip of the probe needle can come into contact with the fiber material. Furthermore, the fiber material includes the first and second fiber materials extending in their respective different directions and fixed to each other at a region thereof. As such, when the tip of the probe needle is pressed against the fiber material, the fiber material will not completely be deformed according to the shape of the probe needle and high pressure can be maintained at the contact surface between the tip of the probe needle and the fiber material. Consequently, foreign matters adhering to the surface of the tip of the probe needle can be removed from the surface of the tip of the probe needle by the fiber material.

Furthermore, since the first and second fiber materials are fixed to each other at a region thereof, the respective shapes of the first and second fiber materials can be maintained by the fixed region. Thus, the conventional use of organic material, such as silicon rubber, is not required for maintaining the respective shapes of the first and second fiber materials. As such, when the tip of a probe needle is stuck into the abrasive member to remove foreign matters from the probe needle, organic materials, such as silicon rubber, can be prevented from adhering to the surface of the probe needle. Accordingly, the foreign matters that have once been removed from the surface of the probe needle can be prevented from disadvantageously adhering again to the probe needle and this can eliminate the cleaning steps conventionally provided for removing foreign matters which have again adhered to a probe needle.

In the above aspect, the abrasive member for probe needles of a probe card may be structured to have the first and second fiber materials in a stacked structure. The fixed region may be formed by sintering the first and second fiber materials. Since the first and second fiber materials are stacked, the first and second fiber materials are located at the respective different depths from the surface of the abrasive member pressed by a probe needle in removing foreign matters from the surface of the probe needle. As such, the probe needle can be brought into contact with the first and second fiber materials at their respective different depths from the surface of the abrasive member. Consequently, the probe needle can come into contact with the first and second fiber materials more frequently so that foreign matters can be more efficiently removed from the probe needle.

Furthermore, since the first and second fiber materials each extend in a different direction and are also stacked and the fiber material thus has a net structure, any foreign matters removed from the surface of the probe needle can be effectively held in the spaces of the net structure of the fiber material and can thus be prevented from adhering again to the probe needle.

Furthermore, the fixed region may be formed by sintering the first and second fiber materials. As such, if a substance, such as organic substances including silicon rubber or the like, which causes foreign matters to adhere again to a probe needle, is mixed with the abrasive member, the sintering step can be provided to incinerate and thus remove the substance from the inside of the abrasive member. Accordingly, the foreign matters can be efficiently prevented from adhering again to the probe needle and this can eliminate the probe needle cleaning step conventionally provided after the step of removing foreign matters from the probe needle by means of the abrasive member.

In the abrasive member for probe needles of a probe card in the above one aspect, a hard layer with a hardness higher than that of the fiber material may be formed on a surface of the fiber material so that the hardness and abrasion resistance of the fiber material can be improved and the life of the abrasive member can thus be prolonged. The enhanced hardness of the fiber material can also efficiently remove foreign matters from the probe needle and this can reduce the time required for the step of removing foreign matters from the probe needle by pressing the probe needle against the abrasive member.

In the abrasive member for probe needles of a probe card in the above one aspect, the fiber material may have a polygonal cross section so that the fiber material has a corner. As such, when the probe needle is pressed against the abrasive member, the corner acts like a blade and thus allows foreign matters to be more efficiently removed from the surface of the probe needle.

In another aspect of the present invention, a cleaning device for probe needles of a probe card includes an abrasive member including at least one type of fiber material selected from the group consisting of metal fiber, carbon fiber and ceramic fiber. The fiber material includes first and second fiber materials extending in their respective different directions and fixed to each other at a region thereof. A space having approximately the same width as that of the tip of the probe needle is formed in a surface of the abrasive member.

As such, when the tip of the probe needle is pressed against the abrasive member, the tip can enter the inside of the abrasive member and can thus be brought into contact with the first and second fiber materials in the abrasive member. Furthermore, the fiber material includes the first and second fiber materials extending in their respective different directions and fixed to each other at a region thereof. As such, when the tip of the probe needle is pressed against the fiber material, the fiber material will not completely be deformed according to the shape of the tip of the probe needle and high pressure can thus be maintained at the contact surface between the tip of the probe needle and the fiber material. Consequently, any foreign matters adhering to the surface of the tip of the probe needle can be removed by the fiber material from the surface of the tip of the probe needle.

Furthermore, since the first and second fiber materials are fixed to each other at a region thereof, the respective shapes of the first and second fiber materials can be maintained by the fixed region. As such, the conventional use of organic substances, such as silicon rubber, is not required for maintaining the respective shapes of the first and second fiber materials. Accordingly, adhesion of organic substances, such as silicon rubber, to the surface of a probe needle can be prevented in the step of pressing the tip of the probe needle against the abrasive member to remove foreign matters from the probe needle. Consequently, the foreign matters which have once been removed from the surface of the probe needle can be prevented from disadvantageously adhering again to the probe needle. Furthermore, since organic substances, such as silicon rubber, are not used in the abrasive member, such problems can be avoided as production of foreign matters due to partial removal of the organic substance, adhesion of the foreign matters to the probe needle and the like, and this can eliminate the cleaning step conventionally provided for removing foreign matters which have again adhered to the probe needle.

In the cleaning device for probe needles of a probe card in the above another aspect of the present invention, the abrasive member may have the first and second fiber materials in a stacked structure. The fixed region may be formed by sintering the first and second fiber materials. Since the first and second fiber materials are provided in a stacked structure, the first and second fiber materials are located at their respective different depths from the surface of the abrasive member pressed by a probe needle in removing foreign matters from the surface of the probe needle. The probe needle can thus be brought into contact with the first and second fiber materials at their respective different depths from the surface of the abrasive member. Accordingly, the probe needle can be brought into contact with the fiber material more frequently and foreign matters can thus be more effectively removed from the probe needle.

Furthermore, since the fixed region is formed by sintering the first and second fiber materials, the sintering step can incinerate any substance, such as organic substances including e.g. silicon rubber, causing foreign matters to adhere again to a probe needle that has been mixed with the abrasive member in a process for manufacturing the abrasive member and the substance can thus be removed from the inside of the abrasive member. Thus, foreign matters can be effectively prevented from adhering again to the probe needle and this can eliminate the probe needle cleaning step conventionally provided after sticking the probe needle into the abrasive member to remove foreign matters from the surface of the probe needle.

In the cleaning device for probe needles of a probe card in the above another aspect of the present invention, the height variation of the surface of the abrasive member in the vertical direction may be approximately no greater than the height variation of the tips of a plurality of probe needles in the vertical direction. Accordingly, for a probe card provided with a plurality of probe needles, the probe needles can be prevented from deformation exceeding the range of the height variation of the tips in the vertical direction when the probe needles are stuck into the abrasive member a plurality of times to remove foreign matters from the surfaces of the tips of the probe needles. Consequently, increased height variation of the tips of the probe needles in the vertical direction can be avoided in the step of sticking the probe needles into the abrasive member to remove foreign matters from the probe needles.

The cleaning device for a probe needle of a probe card in the above another aspect of the present invention may also include a holding member for fixing the abrasive member. The height variation in the vertical direction of that surface of the holding member on which the abrasive member is fixed may be no greater than the height variation of the tips of a plurality of the probe needles in the vertical direction. Accordingly, for a probe card provided with a plurality of probe needles, the probe needles can be prevented from deformation exceeding the range of the height variation of the tips in the vertical direction when the probe needles are stuck into the abrasive member fixed to the holding member a plurality of times to remove foreign matters from the surface of the tips of the probe needles. Thus, increased height variation of the tips of the probe needles in the vertical direction can be prevented in the step of sticking the probe needles into the abrasive member to remove foreign matters from the probe needles.

The cleaning device for a probe needle of a probe card in the above another aspect of the present invention may also include means for at least partially removing static electricity generated at the probe needle. Accordingly, foreign matters can be restricted from adhering again to the probe needle due to static electricity. Consequently, the cleaning step for removing foreign matters which have again adhered to the probe needle can be more surely eliminated after the step of pressing the probe needle against the abrasive member to remove foreign matters from the probe needle.

The cleaning device for a probe needle of a probe card in the above another aspect may also include means for sucking foreign matters removed from the probe needle. Thus, the foreign matters once removed from the probe needle can be prevented from adhering again to the probe needle. Accordingly, the cleaning step for removing foreign matters which have again adhered to the probe needle can be eliminated after the step of pressing the probe needle against the abrasive member to remove foreign matters from the probe needle.

In the cleaning device for a probe needle of a probe card in the above another aspect of the present invention, a hard layer having a greater hardness than that of the fiber material may be formed on a surface of the fiber material to enhance the hardness and abrasion resistance of the fiber material and thus prolong the life of the abrasive member. Furthermore, the enhanced hardness of the fiber material allows foreign matters to be more efficiently removed from the probe needle and thus reduce the time required for the step of pressing the probe needle against the abrasive member to remove foreign matters from the probe needle.

In the cleaning device for a probe needle of a probe card in the above another aspect, the fiber material may have a polygonal cross section so that the fiber material has a corner. As such, when a probe needle is pressed against the abrasive member, the corner acts like a blade and can thus scratch foreign matters off the surface of the probe needle, and thus allows foreign matters to be more effectively removed from the surface of the probe needle.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
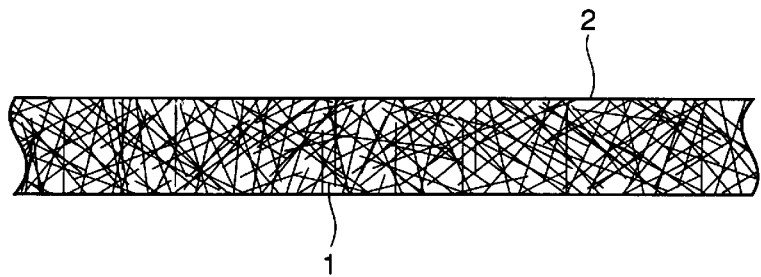
FIG. 1 is a schematic view of a cross section of an abrasive sheet for a probe needle of a probe card according to a first embodiment of the present invention.

Referring to FIG. 1, an abrasive sheet 2 for a probe needle of a probe card according to the first embodiment of the present invention is formed of a stainless steel fiber 1 (SUS316L) of approximately 1 to 30 $\mu$m in diameter. Webs obtained by opening stainless steel fiber 1 are stacked and sintered to form the FIG. 1 abrasive sheet 2 having a thickness of approximately 300 to 400 $\mu$m. It should be noted, however, that the thickness of abrasive sheet 2 need be only several times greater than the length of that portion of the tip of a probe needle which is stuck into abrasive sheet 2. In the stacking and sintering step, the webs are compressed and thus shaped so that the height variation of the surface of the abrasive sheet 2 in the vertical direction is no greater than ±3 $\mu$m.

Since abrasive sheet 2 is formed by stacking and sintering the webs formed by opening stainless steel fiber 1, a plurality of stainless steel fibers 1 are stacked in the surface of abrasive sheet 2 such that they extend in different directions and thus form a net structure. Accordingly, the diameter of stainless steel fiber 1 and the density of the webs in stacking and sintering them can be adjusted to form almost a same space as the diameter of the tip of a probe needle in the surface of abrasive sheet 2, so that the tip of the probe needle pressed against the surface of the abrasive sheet 2 can enter into abrasive sheet 2. Furthermore, since stainless steel fibers 1 are stacked to form a net structure, stainless steel fiber 1 and the tip of the probe needle can come into contact with each other in abrasive sheet 2 when the tip of the probe needle is pressed against abrasive sheet 2.

Furthermore, since stainless steel fibers 1 form a net structure, the contact points between the fibers are fixed when the fibers are stacked and sintered. As such, when a probe needle is pressed against abrasive sheet 2, stainless steel fibers 1 are not completely deformed according to the shape of the probe needle and high pressure can thus be maintained at the contact surface between the probe needle and stainless steel fiber 1. Consequently, foreign matters adhering to the surface of the probe needle can be effectively removed from the surface of the probe needle by stainless steel fiber 1.

Furthermore, since stainless steel fibers are stacked and sintered to form a net structure, foreign matters removed from the surface of the probe needle can be held in the net structure of stainless steel fibers 1. The foreign matters once removed from the surface of the probe needle can thus be prevented from adhering again to the surface of the probe needle.

Furthermore, since stainless steel fibers 1 are stacked and sintered to form abrasive sheet 2, contact points of stainless steel fibers 1 are fixed to each other. It is thus not necessary to conventionally use an organic substance, such as silicon rubber, to maintain the shape of abrasive sheet 2. As such, when the step of pressing a probe needle against abrasive sheet 2 is performed to remove foreign matters from the probe needle, foreign matters, such as silicon rubber which would be conventionally produced from abrasive sheet 2, will not be produced and hence will not adhere to the probe needle. Furthermore, the elimination of the use of an organic substance, such as silicon rubber, can prevent such problems as adhesion of softened silicon rubber to the surface of the probe needle and hence adhesion of foreign matters to the surface of the probe needle due to the softened and hence more viscous silicon rubber.

Furthermore, since stainless steel fibers 1 are stacked and sintered to form abrasive sheet 2, a structure can be formed in which a plurality of layers of stainless steel fibers 1 are stacked. Accordingly, the number of contact points between the surface of a probe needle and stainless steel fiber 1 can be increased in pressing the probe needle against abrasive sheet 2, and foreign matters can thus be more effectively removed from the probe needle.

Furthermore, the formation of abrasive sheet 2 by stacking and sintering stainless steel fibers 1 allows incineration and hence removal of such a substance, e.g. an organic substance, causing adhesion of foreign matters to a probe needle that is mixed into abrasive sheet 2 during the process for manufacturing abrasive sheet 2. Accordingly, such a problem as adhesion of an organic substance, e.g. silicon rubber, to a probe needle can be prevented in the step of pressing the probe needle against abrasive sheet 2 to remove foreign matters from the probe needle.

Furthermore, a height variation of the surface of abrasive sheet 2 in the vertical direction is no greater than ±3 μm and is thus approximately equal to that of the tip of a probe needle. This prevents the probe needle from deformation exceeding the range of the height variation of the tip of the probe needle in the vertical direction when a plurality of probe needles are pressed against abrasive sheet 2 a plurality of times. Thus, the height variation of the tip of the probe needle in the vertical direction can be prevented from increasing during the step of pressing the probe needle against abrasive sheet 2.

Figure 20:
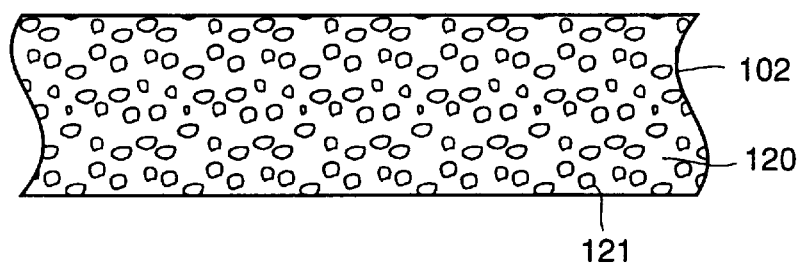
FIG. 20 schematically shows a cross section of a conventional abrasive sheet for a probe needle of a probe card.
Figure 21:
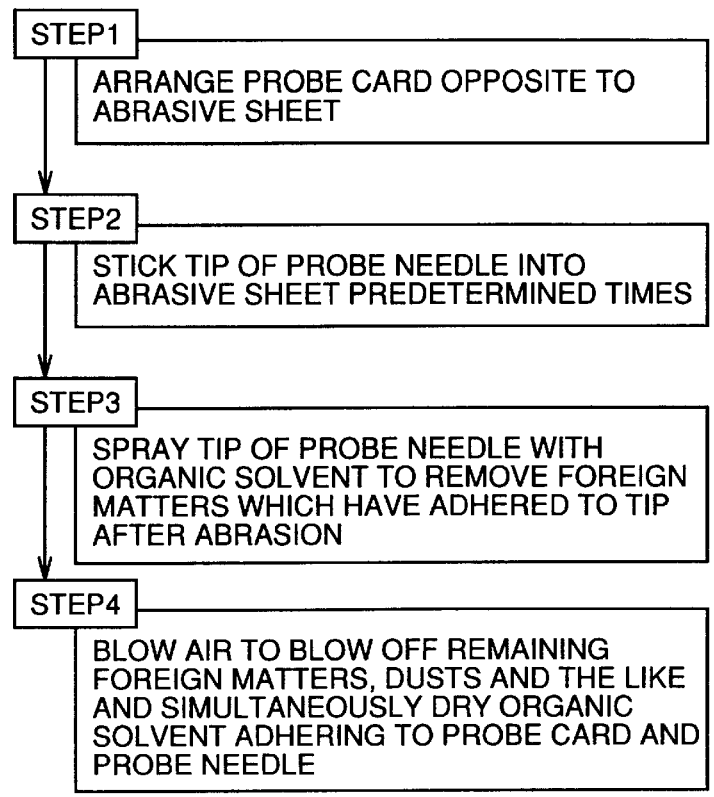
FIG. 21 is a flow chart of a cleaning operation of a probe needle of a probe card, employing the conventional abrasive sheet shown in FIG. 20.
Figure 22:
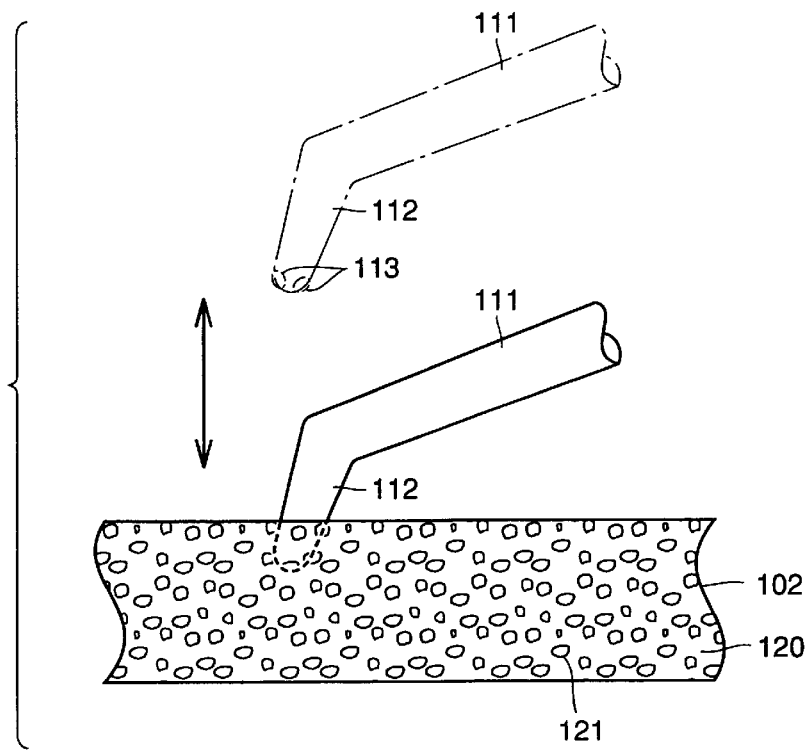
FIG. 22 is a schematic view for illustrating the step 2 in the FIG. 21 conventional cleaning operation of a probe needle of a probe card.
Figure 23:
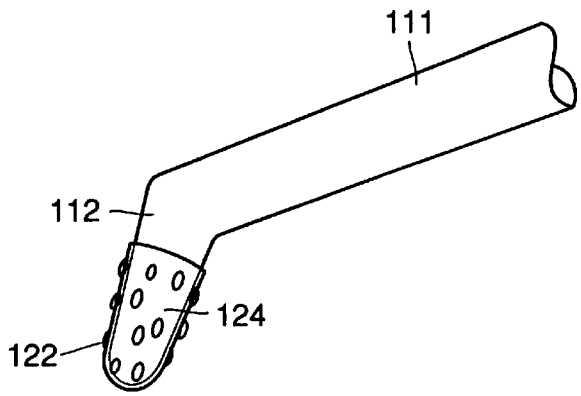
FIG. 23 schematically shows a condition of a probe needle at the completion of step 2 of the FIG. 21 conventional cleaning operation of a probe needle of a probe card.
Figure 24:
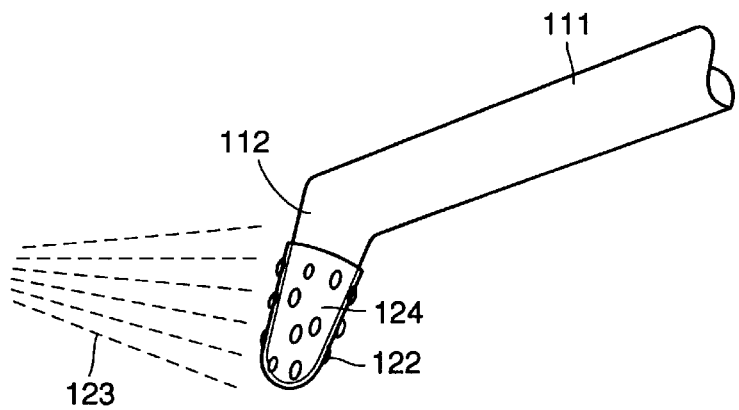
FIG. 24 is a schematic view for illustrating step 3 of the FIG. 21 conventional cleaning operation of a probe needle of a probe card.
Figure 25:
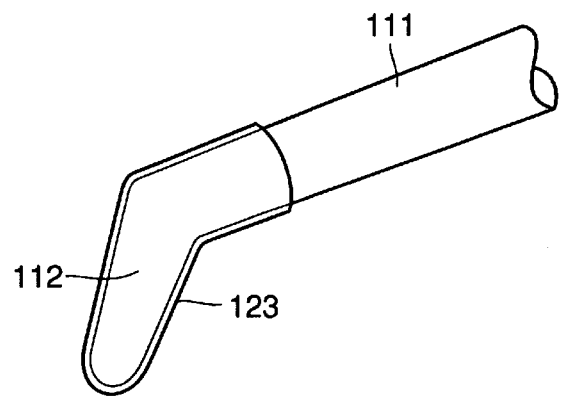
FIG. 25 schematically shows a condition of a probe needle at the completion of step 3 of the FIG. 21 conventional cleaning operation of a probe needle of a probe card.

The abrasive member according to the first embodiment of the present invention is also cost-effective, since the manufacturing cost thereof can be approximately one fourth of that of abrasive sheet 102 as an example of a conventional abrasive member with abrasive grains of artificial diamond dispersedly arranged in silicon rubber (FIG. 20).

Furthermore, since foreign matters adhering to a probe needle are removed by stainless steel fiber 1, the surface of the probe needle is prevented from being scratched off, as with a conventional abrasive sheet with abrasive grains of artificial diamond dispersedly arranged in silicon rubber. Accordingly, the lifetime of the probe needle can be prolonged.

For a probe needle with its tip coated with a hard layer of e.g. TiNC, conventional abrasive sheets also scratch off the hard layer on the surface of the probe needle in the foreign matter removal step due to abrasive grains of artificial diamond and thus disadvantageously reduce the lifetime of the probe needle, while abrasive sheet 2 according to the first embodiment of the present invention does not scratch off the hard layer of the probe needle and thus can avoid such a problem as shortened lifetime of the probe needle.

Figure 2:
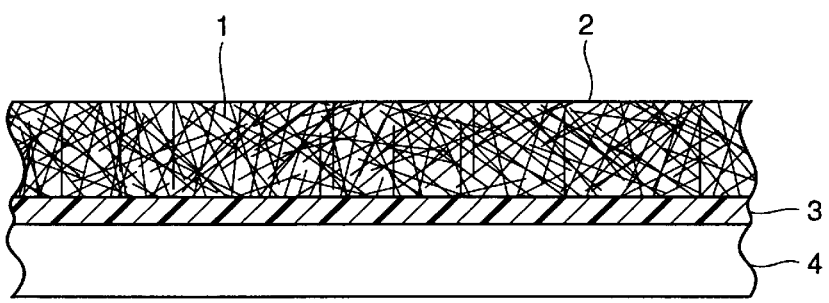
FIG. 2 is a schematic view in cross section of a portion of a cleaning device wherein the abrasive sheet for a probe needle of a probe card according to the first embodiment of the present invention shown in FIG. 1 is fixed to a fixing silicon wafer.

FIG. 2 shows abrasive sheet 2 fixed on an abrasive member fixing base 4 by adhesive double coated tape 3. Abrasive member fixing base 4 employs a silicon wafer which is polished such that the height variation in the vertical direction of that surface of base 4 on which abrasive sheet 2 is fixed is no greater than that of the tip of a probe needle in the vertical direction, i.e., no greater than ±3 μm. Such a processing of base 4 that the height variation in the vertical direction of that surface of base 4 on which abrasive sheet 2 is fixed is no greater than that of the tip of the probe needle in the vertical direction, can prevent deformation of the probe needle exceeding the range of the height variation of the tip of the probe needle in the vertical direction during the step of pressing the probe needle against abrasive sheet 2 fixed on base 4 to remove foreign matters from the probe needle. Thus, the height variation of the tip of the probe needle in the vertical direction can be prevented from increasing during the step of sticking the probe needle into abrasive sheet 2 to remove foreign matters from the probe needle.

Figure 3:
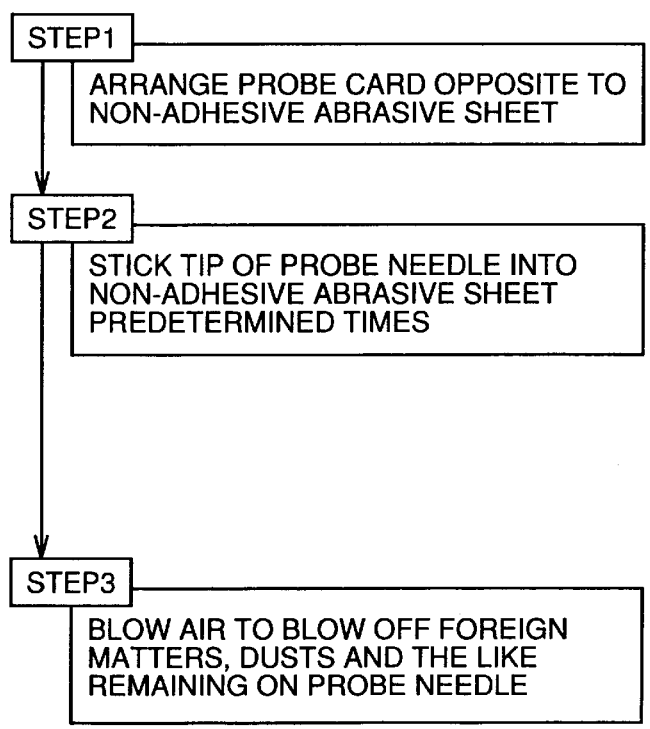
FIG. 3 is a flow chart of a probe needle cleaning operation employing the abrasive sheet for a probe needle of a probe card according to the first embodiment of the present invention shown in FIG. 1.

Referring to FIG. 3, a probe needle cleaning operation according to the first embodiment of the present invention is constituted by three steps.

Figure 4:
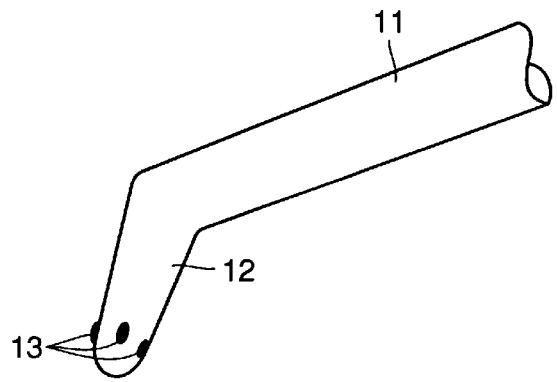
FIG. 4 schematically shows a probe needle with foreign matters adhering to the tip thereof.

Step 1 is the step of arranging a probe card opposite to abrasive sheet 2 shown in FIG. 1. A foreign matter 13, such as aluminum oxide, adheres to a tip 12 of a probe needle 11 of the probe card, as shown in FIG. 4.

Figure 5:
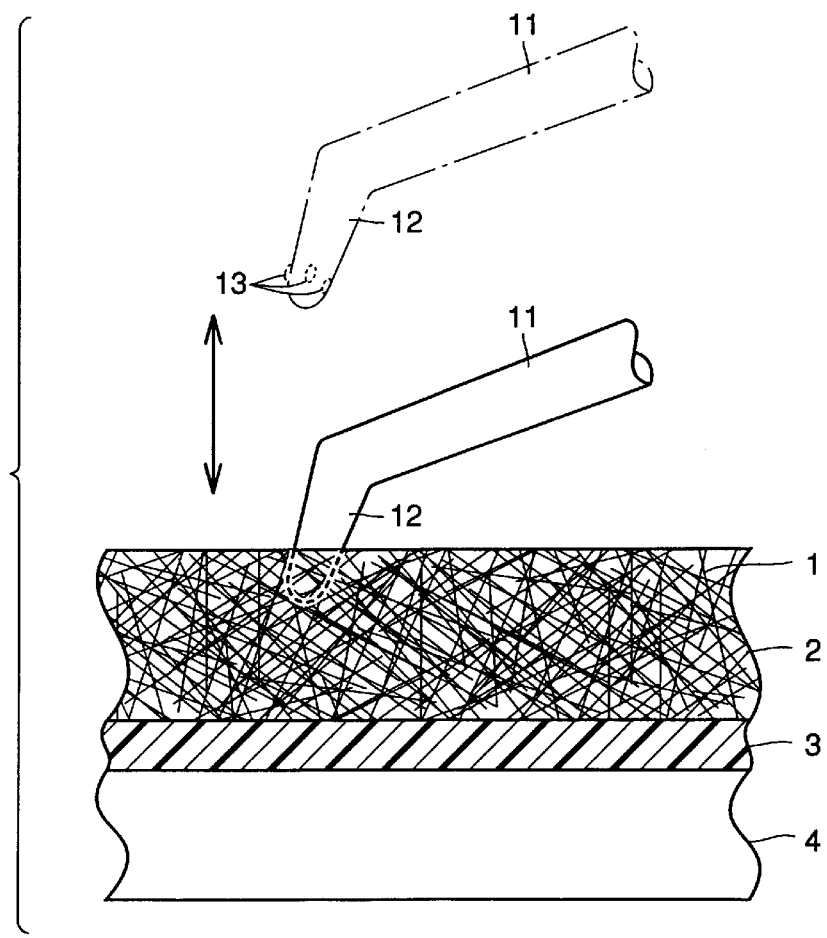
FIG. 5 schematically shows the operation in step 2 of the FIG. 3 probe needle cleaning operation according to the first embodiment of the present invention.
Figure 6:
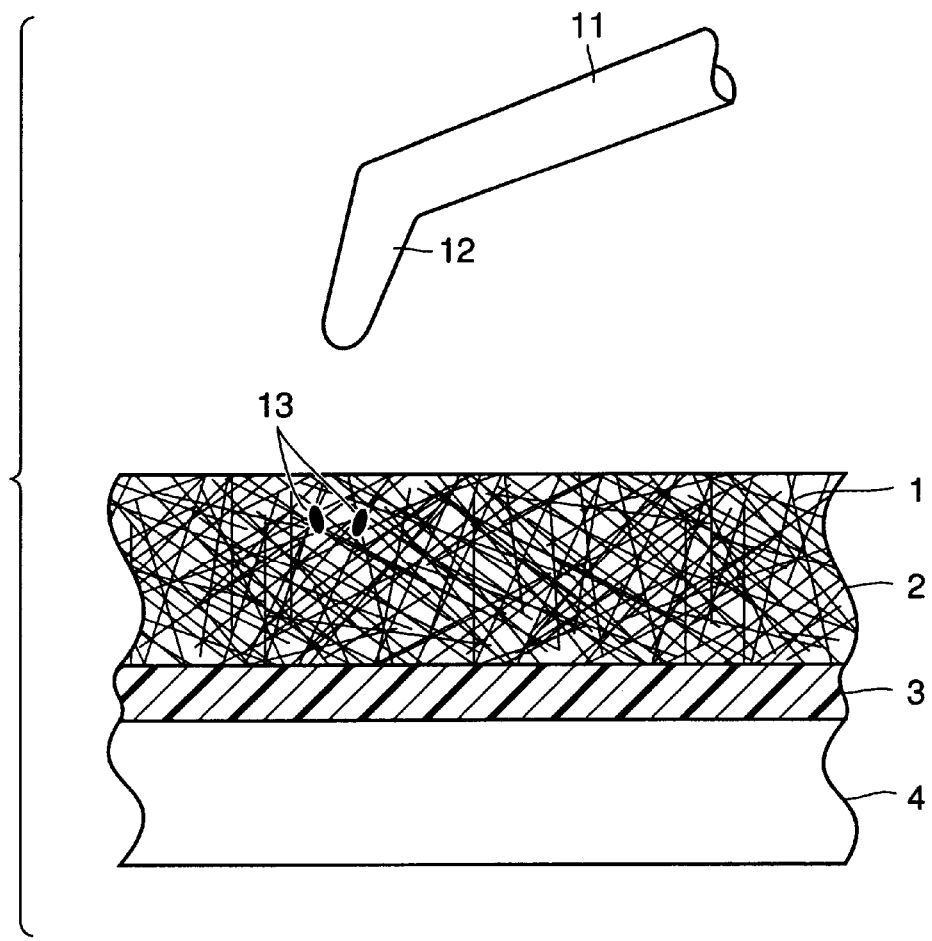
FIG. 6 schematically shows the completion of the step indicated in step 2 of the FIG. 3 probe needle cleaning operation according to the first embodiment of the present invention.

Step 2 is the step of sticking the tip of the probe needle into the abrasive sheet 2 (shown in FIG. 5) predetermined times. FIG. 5 schematically illustrates step 2 of sticking the tip of the probe needle into abrasive sheet 2 predetermined times. As shown in FIG. 5, tip 12 of probe needle 11 is stuck into abrasive sheet 2 so that foreign matter 13, such as aluminum oxide, adhering to tip 12 of probe needle 11 can be scratched off by stainless steel fiber 1 in abrasive sheet 2. When the step shown in FIG. 5 is completed, foreign matter 13 removed from tip 12 of probe needle 11 has been captured in the net structure formed by stacked and sintered stainless steel fibers 1 of abrasive sheet 2, as shown in FIG. 6, and can be prevented from disadvantageously adhering again to tip 12 of probe needle 11.

Accordingly, the cleaning operation of a probe needle for a probe card according to the first embodiment of the present invention is not provided with the cleaning step conventionally employing an organic solvent after step 2, as indicated in FIG. 3. If any foreign matters, such as dusts, remain on tip 12 of the probe needle 11 (FIG. 6), the step of blowing air on tip 12 of the probe needle 11 can be provided as step 3 to remove the foreign matters.

The probe needle cleaning operation according to the first embodiment is thus performed.

Figure 7:
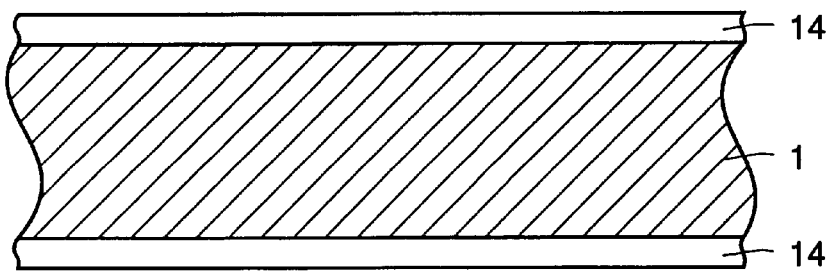
FIG. 7 is a schematic cross section of a variation of a stainless steel fiber which forms the FIG. 1 abrasive sheet according to the first embodiment of the present invention.

For the abrasive sheet according to the first embodiment, a hard layer 14 of TiN may be formed on a surface of stainless steel fiber 1 constituting abrasive sheet 2 (FIG. 1), as shown in FIG. 7, to enhance the hardness of the surface of stainless steel fiber 1. Thus, foreign matter 13 can be more efficiently removed from tip 12 of probe needle 11 in the FIG. 5 step of sticking tip 12 of probe needle 11 into abrasive sheet 2 predetermined times. Accordingly, the frequency at which probe needle 11 is stuck into abrasive sheet 2 in the step shown in FIG. 5 can be decreased to reduce the time required for this step. It should be noted that, referring to FIG. 7, hard layer 14 formed on a surface of stainless steel fiber 1 may be a layer containing e.g. TiC, SiC, TiCN or abrasive grains of artificial diamond and may be formed by injecting nitrogen or carbon into the surface of stainless steel fiber 1.

Figure 8:
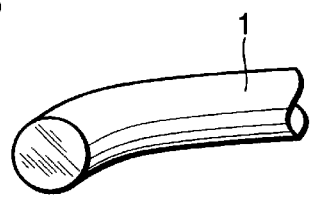
FIG. 8 schematically shows a cross sectional shape of a stainless steel fiber which forms the abrasive sheet according to the first embodiment of the present invention shown in FIG. 1.
Figure 9:
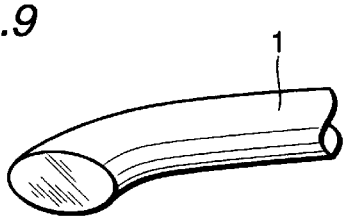
FIGS. 9–12 schematically show first to fourth variations in cross section of the FIG. 8 stainless steel fiber according to the first embodiment of the present invention, respectively.
Figure 10:
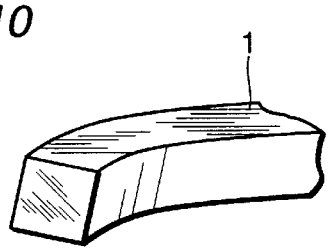
Figure 11:
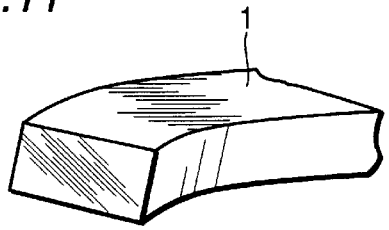
Figure 12:
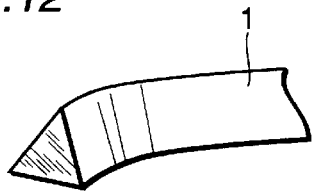

The shape in cross section of stainless steel fiber 1 (FIG. 1) forming abrasive sheet 2 (FIG. 1) according to the first embodiment of the present invention is not limited to a circle as shown in FIG. 8 and may be an oval as shown in FIG. 9. It may also be a polygon, such as a square, a rectangle and a triangle, as shown in FIGS. 10, 11 and 12, respectively. Such a polygonal cross section of stainless steel fiber 1 as shown in FIGS. 10–12 allows each stainless steel fiber 1 to have corners. These corners can scratch foreign matter 13 off tip 12 of probe needle 11 like a blade in sticking tip 12 of probe needle 11 into abrasive sheet 2 in the step shown in FIG. 5 so that foreign matter 13 can be more efficiently removed from tip 12.

Second Embodiment

Figure 13:
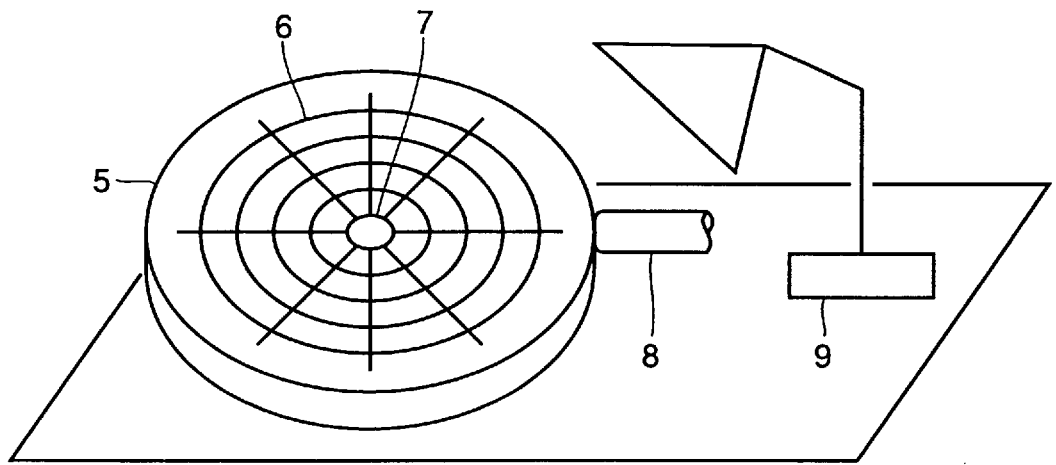
FIG. 13 schematically shows a cleaning device for a probe needle of a probe card according to a second embodiment of the present invention.

Referring to FIG. 13, a cleaning device for a probe needle of a probe card according to a second embodiment of the present invention includes a fixing base 5 for fixing abrasive sheet 2 shown in FIG. 1, and an ionizer 9 for erasing static electricity generated at the probe needle. It should be noted that the ionizer is a device which produces positive and negative ions through corona discharge to neutralize static electricity on a surface of an object. A groove 6 is formed on an abrasive sheet fixing surface of the abrasive sheet fixing base 5. Connected to groove 6 is an opening 7 formed at the center of fixing base 5 to suck foreign matters. Opening 7 for sucking foreign matters is connected to a tubing (not shown) internal to fixing base 5 and to a tubing 8 for connection from fixing base 5 to an exhaust pump (not shown).

Abrasive sheet 2 shown in FIG. 1 is fixed on fixing base 5 to perform a cleaning operation of a probe needle of a probe card, as shown in FIG. 3. A hard layer of TiN, as shown in FIG. 7 may be provided on a surface of stainless steel fiber 1 (FIG. 1) forming abrasive sheet 2 used here and the shape in cross section of stainless steel fiber 1 may be such a shape as shown in FIGS. 8–12 to obtain an effect similar to that of the first embodiment. Since the cleaning device for a probe needle of a probe card according to the second embodiment of the present invention includes ionizer 9, as described above, ionizer 9 can remove from a probe needle static electricity generated at the tip of the probe needle during the step of sticking the tip of the probe needle into an abrasive sheet predetermined times (FIG. 3). Thus, foreign matters can be prevented from adhering again to the probe needle due to static electricity generated at the surface of the probe needle. Accordingly, it is not necessary to provide any conventional cleaning step employing an organic solvent or the like after the step of sticking the tip of a probe needle into an abrasive sheet predetermined times (FIG. 3), and the number of the steps of the probe needle cleaning operation can be reduced as compared with that of the steps of conventional probe needle cleaning operations.

Furthermore, since groove 6 and opening 7 for sucking foreign matters are formed at a surface of abrasive sheet fixing base 5, foreign matter 13 (shown in FIG. 6) held in abrasive sheet 2 (FIG. 6) can be sucked from abrasive sheet 2 and discharged from abrasive sheet fixing base 5 via groove 6 and opening 7 to the external in the step of sticking the tip of a probe needle into the abrasive sheet predetermined times (FIG. 3). Foreign matter 13 (FIG. 6) can thus be prevented from adhering again to the probe needle.

The removal of foreign matter 13 from the abrasive sheet can also prevent foreign matter 13 from being collected in the abrasive sheet and thus allows a prolonged lifetime of the abrasive sheet.

Figure 14:
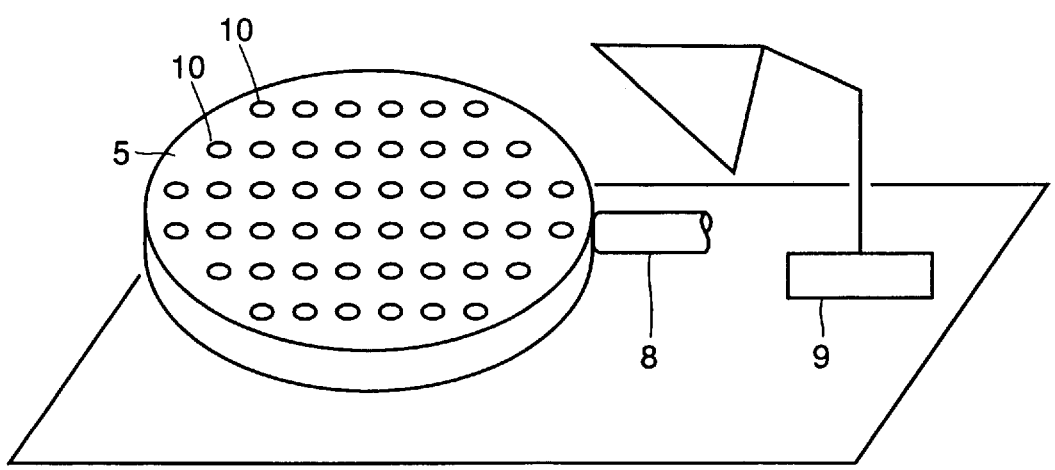
FIG. 14 schematically shows a variation of the FIG. 13 cleaning device for a probe needle of a probe card according to the second embodiment of the present invention.
Figure 15:
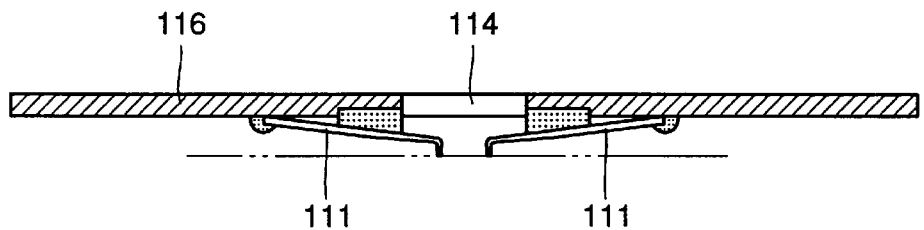
FIG. 15 is a cross section for illustrating a conventional probe card.
Figure 16:
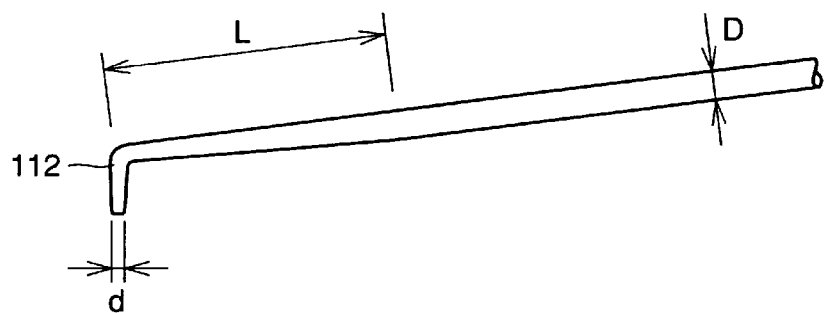
FIG. 16 is a schematic view for illustrating a conventional probe needle.
Figure 17:
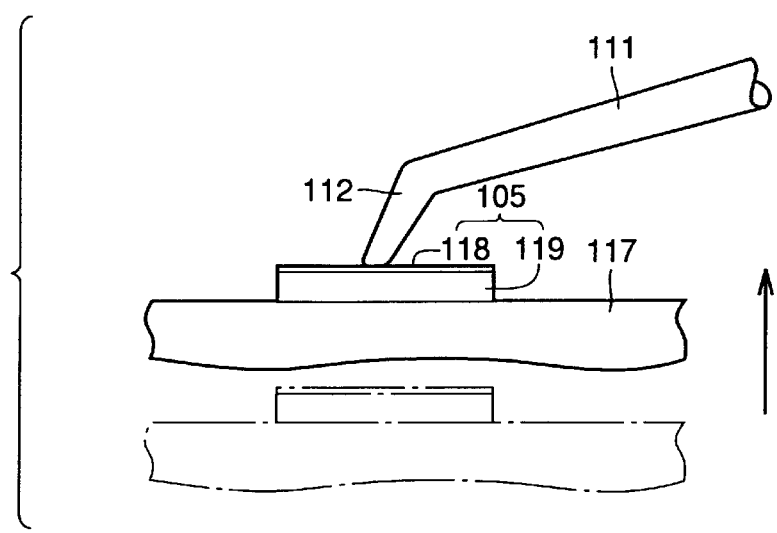
FIGS. 17 and 18 are schematic views for illustrating first and second steps of bringing a probe needle into contact with an electrode of a semiconductor device in inspecting electrical characteristics of the semiconductor device, respectively.
Figure 18:
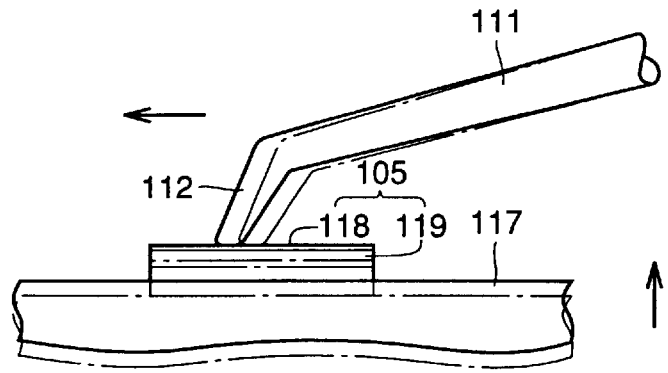
Figure 19:
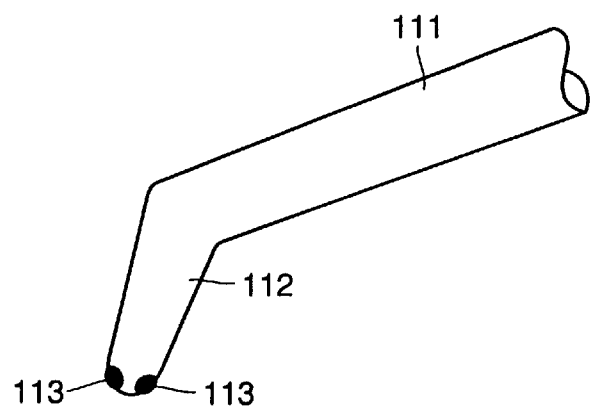
FIG. 19 schematically shows a probe needle with foreign matters adhering to the tip thereof.

Referring to FIG. 14, an variation of the cleaning device for a probe needle of a probe card according to the second embodiment of the present invention is basically similar in configuration to the cleaning device for a probe needle of a probe card shown in FIG. 13. It should be noted, however, that the variation has a plurality of openings 10 for sucking foreign matters formed across a surface of abrasive sheet fixing base 5. The provision of opening 10 for sucking foreign matters removed from a probe needle in the variation according to the second embodiment of the present invention also allows foreign matters to be sucked and thus removed from the abrasive sheet, as with the probe needle cleaning device shown in FIG. 13, and can thus prevent the foreign matters from adhering again to the probe needle.

While the cleaning devices for a probe needle of a probe card shown in FIGS. 13 and 14 have foreign matter sucking openings 7 and 10 and groove 6 formed in a surface of abrasive sheet fixing base 5 to remove foreign matters from the back surface of the abrasive sheet, the cleaning devices may be provided with a sucking member to suck foreign matters from the front surface of the abrasive sheet (i.e., the surface into which a probe needle is stuck) so as to achieve a similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An abrasive member for a probe needle of a probe card, comprising:

first and second fiber materials; formed of at least one selected from the group consisting of a metal fiber, a carbon fiber and a ceramic fiber, wherein said first and second fiber materials each extends in a different direction from each other and have a region fixed to each other; and a surface provided with a space having approximately the same width as a width of a tip of a probe needle to be abraded, wherein said first and second fiber materials are stacked to form a net structure and said region fixed is formed by sintering said first and second fiber materials.

2. The abrasive member for a probe needle of a probe card according to claim 1, wherein a hard layer having a hardness higher than a hardness of said fiber material is formed on a surface of said fiber material.

3. The abrasive member for a probe needle of a probe card according to claim 1, wherein said fiber material has a polygonal cross section.

4. A method for cleaning a probe needle of a probe card comprising contacting the probe needle with the abrasive member according to claim 1.

5. A cleaning device for a probe needle of a probe card, comprising an abrasive member including first and second fiber materials; formed of at least one selected from the group consisting of a metal fiber, a carbon fiber and a ceramic fiber, wherein:

said first and second fiber materials each extending in a different direction from each other and having a region fixed to each other; and a space having approximately a same width as a width of a tip of a probe needle to be cleaned is provided in a surface of said abrasive member, wherein said abrasive member has said first and second fiber materials stacked and said region fixed is formed by sintering said first and second fiber materials.

6. The cleaning device for a probe needle of a probe card according to claim 5, wherein a height variation in a vertical direction of a surface of said abrasive member is approximately no greater than a height variation in a vertical direction of tips of a plurality of said probe needles.

7. The cleaning device for a probe needle of a probe card according to claim 5, further comprising a holding member for fixing said abrasive member, wherein a height variation in a vertical direction of a surface of said holding member fixing said abrasive member thereon is approximately no greater than a height variation in the vertical direction of tips of a plurality of said probe needles.

8. The cleaning device for a probe needle of a probe card according to claim 5, further comprising means for at least partially erasing static electricity generated at said probe needle.

9. The cleaning device for a probe needle of a probe card according to claim 5, further comprising means for sucking a foreign matter removed from said probe needle.

10. The cleaning device for a probe needle of a probe card according to claim 5, wherein a surface of said fiber material is provided with a hard layer having a hardness higher than a hardness of said fiber material.

11. The cleaning device for a probe needle of a probe card according to claim 5, wherein said fiber material has a polygonal cross section.

12. A method for cleaning a probe needle of a probe card comprising contacting the probe needle with the cleaning device according to claim 5.

* * * * *